(12) United States Patent
Suzuki

(10) Patent No.: US 7,500,171 B2
(45) Date of Patent: Mar. 3, 2009

(54) MEMORY CIRCUIT

(75) Inventor: Toshikazu Suzuki, Hyogo (JP)

(73) Assignee: Panasonic Corporation, Osaka (JP)

( * ) Notice: Subject to any disclaimer, the term of this patent is extended or adjusted under 35 U.S.C. 154(b) by 512 days.

(21) Appl. No.: 11/339,479

(22) Filed: Jan. 26, 2006

(65) Prior Publication Data
US 2006/0184856 A1 Aug. 17, 2006

(30) Foreign Application Priority Data
Jan. 31, 2005 (JP) ............................. 2005-023307

(51) Int. Cl.
*G11C 29/00* (2006.01)
(52) U.S. Cl. .................... 714/763; 714/718; 714/766
(58) Field of Classification Search ................ 714/763, 714/766, 719, 764, 757
See application file for complete search history.

(56) References Cited

U.S. PATENT DOCUMENTS

| | | | | |
|---|---|---|---|---|
| 4,748,627 A | * | 5/1988 | Ohsawa | ...................... 714/764 |
| 5,263,031 A | * | 11/1993 | Inoue | ........................ 714/766 |
| 5,379,413 A | * | 1/1995 | Hazen et al. | ................. 714/719 |
| 5,459,850 A | * | 10/1995 | Clay et al. | ................... 711/171 |
| 2003/0008446 A1 | | 1/2003 | Osada et al. | |
| 2005/0024974 A1 | * | 2/2005 | Noguchi et al. | ........ 365/230.03 |

OTHER PUBLICATIONS

Furutani, Kiyohiro., et al. "A Built-In Hamming Code ECC Circuit for DRAM's." IEEE Journal of Solid-State Circuits, vol. 24, No. 1, Feb. 1989, pp. 50-56.

* cited by examiner

*Primary Examiner*—Guy J Lamarre
*Assistant Examiner*—Fritz Alphonse
(74) *Attorney, Agent, or Firm*—McDermott Will & Emery LLP

(57) ABSTRACT

A memory circuit includes a data storage section for storing a plurality of data sets and a plurality of redundant data sets, which are used for error correction for the data sets; and an error correction section for performing at least error detection for the data sets in the data storage section by using the redundant data sets when the memory circuit is not accessed from outside for data input or output, and outputting at least result of the error detection as an error detection signal. When the memory circuit is accessed so as to output a designated one of the stored data sets, the designated data set is outputted without being subjected to the error detection by the error correction section.

9 Claims, 6 Drawing Sheets

MEMORY CIRCUIT

BACKGROUND OF THE INVENTION

The present invention relates to a memory circuit, and more particularly relates to a memory circuit that includes a circuit for detecting or correcting soft errors in stored data.

In recent years, as semiconductor memory fabrication process has been microscaled, the area of a single memory cell has been continuously reduced. Along with this, the amount of electric charge accumulated in a memory cell has also been reduced. As a result, the flow of electric charge into the memory cell and the resulting data corruption, caused by incoming alpha radiation and cosmic rays, are becoming serious problems. The data corruption occurs due to changes in the potential of a storage node in the memory cell caused by the flow of electric charge into the storage node, and the memory cell is not physically broken. Therefore, the error can be corrected by a rewrite of correct data at the same address. This kind of error is called a soft error. A soft error is typically dealt with by an error check and correct circuit (ECC circuit).

In a memory circuit including a conventional error check and correct circuit, at the time of data input into the memory, redundant data such as a Hamming code is added and stored together with the main data, and at the time of data output from the memory, the main data and the redundant data are used to reconstruct the input data. For example, if, at the time of input of 32-bit data, 6-bit redundant data using a Hamming code is stored, a 1-bit data error occurring during the data-storing process can be corrected when the data is output (see "A Built-In Hamming Code ECC Circuit for DRAM's" by Kiyohiro FURUTANI et al., IEEE JOURNAL OF SOLID-STATE CIRCUITS, (U.S.A) pp. 50-56, Issue No. 1, Vol. 24, February 1989).

FIG. 4 is a block diagram showing an example of the structure of a conventional memory circuit. The memory circuit of FIG. 4 includes a data storage section 900, an error correction section 920, and an input buffer 932. The data storage section 900 includes a data memory cell array 902, a redundant data memory cell array 904, an address decoder 906, and a control signal input circuit 912. The error correction section 920 includes a coding circuit 924 and an output data error check and correct circuit 928.

FIG. 5 is a circuit diagram showing the structure of the control signal input circuit 912 of FIG. 4. The control signal input circuit 912 includes flip flops 941 and 942 and logic gates 951 and 952.

Data input/output into/from the data storage section 900 is performed in synchronization with a rising edge of a clock signal CLK. When a read/write control signal NWE is at a low potential (which will be hereinafter referred to as the "L" level), the control signal input circuit 912 activates an internal write control signal IWE in synchronization with the clock signal CLK. That is, the control signal input circuit 912 sets the internal write control signal IWE at a high potential (which will be hereinafter referred to as the "H" level). When a memory selection signal NCS is at the "L" level, the control signal input circuit 912 outputs the clock signal CLK as an internal clock signal ICLK.

FIG. 6 is a timing chart showing an example of the operation of the memory circuit of FIG. 4. In FIG. 6, an address signal A is input into the memory circuit at the rising edge of the internal clock signal ICLK, and the address decoder 906 decodes the address signal A and generates a signal AIN for selecting stored data.

The cycle 1 shown in FIG. 6 is a write cycle. Since the read/write control signal NWE goes to the "L" level, the control signal input circuit 912 of FIG. 5 activates the internal write control signal IWE in synchronization with the clock signal CLK.

Then, the input buffer 932 outputs external input data D as internal input data DIN. The internal input data DIN is written into the data memory cell array 902. The coding circuit 924 generates a Hamming code for error correction based on the internal input data DIN and outputs the generated code as redundant data PIN. The redundant data PIN is written into the redundant data memory cell array 904.

The cycles 2 to 4 are read cycles. If the internal write control signal IWE is not activated at a rising edge of the clock signal CLK, the data memory cell array 902 and the redundant data memory cell array 904 output internal output data DOUT and redundant data POUT, respectively, to the output data error check and correct circuit 928.

The output data error check and correct circuit 928 uses the redundant data POUT to perform error correction for the internal output data DOUT and makes a comparison between the corrected data and the read internal output data DOUT so as to detect whether or not an error is contained. Upon detection of an error, the output data error check and correct circuit 928 sets an error detection signal ERR to the "H" level and outputs the error detection signal ERR, and outputs error-corrected output data Q outside the memory circuit.

However, there is a problem with the conventional error check and correct circuit, because the error check and correct circuit is disposed in the data output path, which causes the memory's output access time to be very long as compared with a case in which no error check and correct circuit is provided. Specifically, as shown in FIG. 6, the internal output data DOUT always passes through the error check and correct circuit before it is output as the external output data Q, thereby causing the output access time to be increased.

SUMMARY OF THE INVENTION

An object of the present invention is to provide a memory circuit in which increase in access time is prevented and frequency of occurrence of soft errors is decreased to a sufficient degree for practical use.

An inventive memory circuit includes: a data storage section for storing a plurality of data sets and a plurality of redundant data sets, which are used for error correction for the data sets; and an error correction section for performing at least error detection for the data sets in the data storage section by using the redundant data sets, when the memory circuit is not accessed from outside for data input or output, and outputting at least result of the error detection as an error detection signal, wherein when the memory circuit is accessed so as to output a designated one of the stored data sets, the designated data set is outputted without being subjected to the error detection by the error correction section.

According to the inventive memory circuit, the read data is externally output without being subjected to the process performed by the error correction section. This prevents increase in the output access time. On the other hand, when the memory circuit is not accessed from outside for data input or output, at least error detection is performed for the data sets stored in the data storage section. Therefore, in the case of detection of an error, if the error is corrected and the error-corrected data is rewritten, the rate of occurrence of readout errors caused by soft errors can be reduced.

Preferably, in the memory circuit, the error correction section performs error correction for the data set read from the data storage section by using a corresponding one of the redundant data sets and generates a redundant data set to be used for error correction for the obtained error-corrected data set; and the data storage section rewrites the error-corrected data set and the generated corresponding redundant data set at the same address as that of the data set read from the data storage section.

Preferably, in the memory circuit, the error correction section includes: an output data error check and correct circuit for performing error correction for the data set read from the data storage section by using a corresponding one of the redundant data sets and outputting the obtained error-corrected data and the error detection signal; a data selection circuit for selecting the error-corrected data when the error detection signal indicates detection of an error, and, in other situations, selecting data input from outside, and outputting the selected data to the data storage section; and a coding circuit for generating, based on the data output from the data selection circuit, a redundant data set to be used for error correction for that data and outputting the generated redundant data set to the data storage section.

Preferably, the data storage section includes: a data memory cell array for storing the data sets; a redundant data memory cell array for storing the redundant data sets; a control circuit for outputting an internal address signal, which is used to access the data memory cell array and the redundant data memory cell array; and an address decoder for decoding the internal address signal and supplying the decoded signal to the data memory cell array and the redundant data memory cell array; wherein the control circuit includes an address selector for selecting an error correction internal address signal, generated cyclically for access to the data memory cell array and the redundant data memory cell array, or an external address signal input from outside, latching and then outputting the selected signal as the internal address signal; and wherein the address selector retains the internal address signal without updating the internal address signal, when the error detection signal indicates detection of an error.

Preferably, the control circuit further includes a control signal input circuit for activating an internal write control signal and outputting the activated signal to the data selection circuit, when the error detection signal indicates detection of an error; and the data selection circuit outputs the selected data, when the internal write control signal is activated.

Preferably, the control signal input circuit activates an error correction enable signal and generates and outputs an address counter clock signal, when an input error correction control signal is activated; the control circuit includes an address counter for counting the address counter clock signal and outputting the count value as the error correction internal address signal; and the address selector selects the error correction internal address signal when the error correction enable signal is activated, and, in other situations, selects the external address signal.

According to the present invention, the read data is externally output without being subjected to the process of error detection or error correction. This prevents increase in the output access time. When the memory circuit is not accessed from outside for data input or output, error detection and error correction are performed for the data stored in the memory circuit. Therefore, in the memory circuit, the rate of occurrence of readout errors caused by soft errors can be reduced to a sufficient degree for practical use.

DETAILED DESCRIPTION OF THE INVENTION

Hereinafter, preferred embodiments of the present invention will be described with reference to the accompanying drawings.

Figure 1:
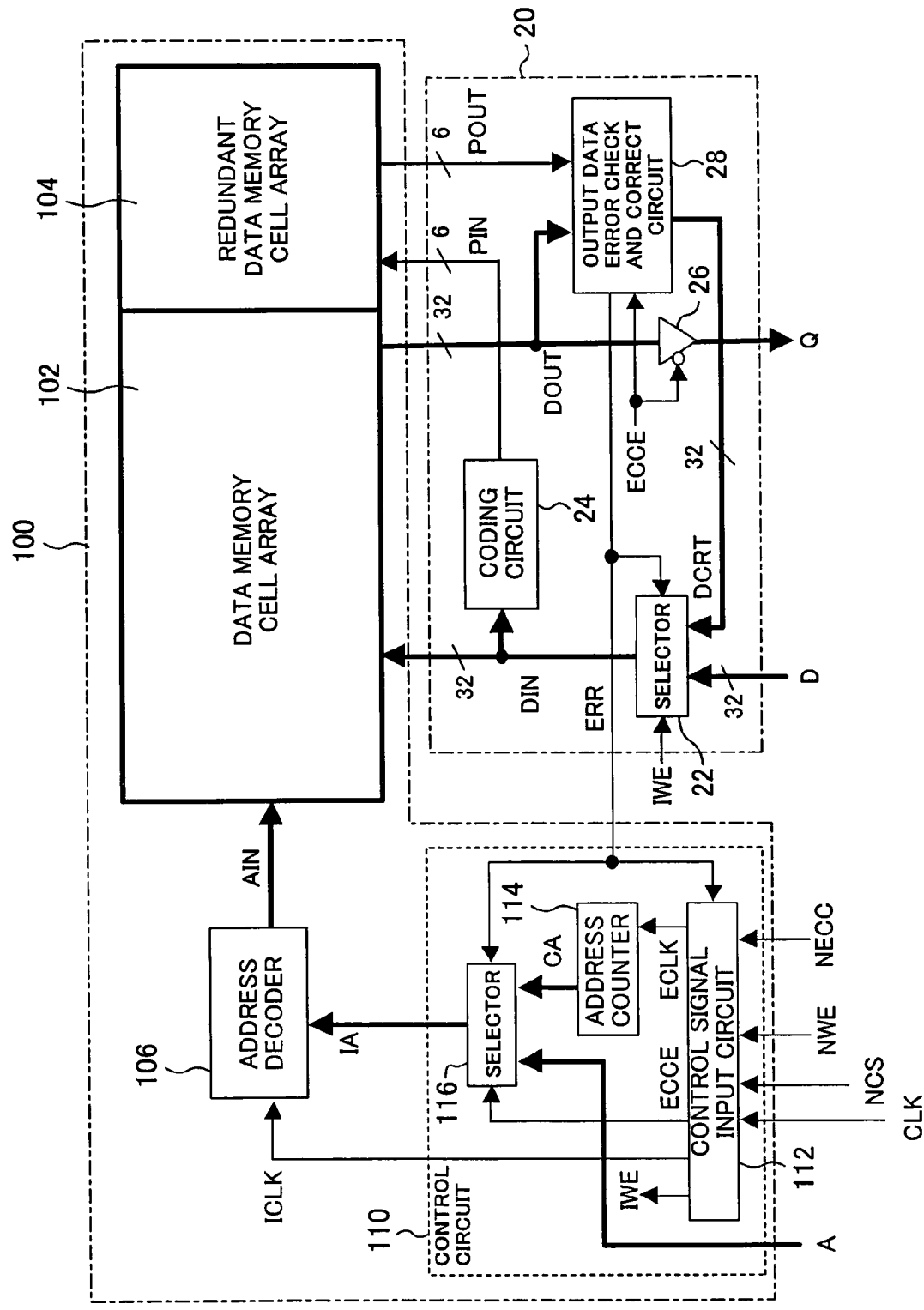
FIG. 1 is a block diagram illustrating the structure of a memory circuit according to the present invention.

FIG. 1 is a block diagram illustrating the structure of a memory circuit according to the present invention. The memory circuit of FIG. 1 includes a data storage section 100 and an error correction section 20. The data storage section 100 includes a data memory cell array 102, a redundant data memory cell array 104, an address decoder 106, and a control circuit 110.

The control circuit 110 includes a control signal input circuit 112, an address counter 114, and an address selector 116 serving as an address control circuit. The error correction section 20 includes a selector 22 serving as a data selection circuit, a coding circuit 24, an output buffer 26, and an output data error check and correct circuit 28.

The control signal input circuit 112 receives a clock signal CLK, a memory selection signal NCS, a read/write control signal NWE, an error correction control signal NECC, and an error detection signal ERR and outputs an internal clock signal ICLK, an internal write control signal IWE, an address counter clock signal ECLK, and an error correction enable signal ECCE.

The address counter 114 makes a count in accordance with the address counter clock signal ECLK and outputs the count value to the selector 116 as an error correction internal address signal CA.

When the error correction enable signal ECCE is at the "H" level, the selector 116 selects the error correction internal address signal CA, while in the other situations, the selector 116 selects an external address signal A. The selector 116 latches the selected signal in synchronization with the clock signal CLK and outputs the latched signal to the address decoder 106 as an internal address signal IA. When the error detection signal ERR is at the "H" level, the selector 116 continues to retain the latched internal address signal IA without updating the internal address signal IA.

The address decoder 106 decodes the internal address signal IA and outputs a signal AIN for selecting data designated by the internal address signal IA from the data stored in the data memory cell array 102 and in the redundant data memory cell array 104.

The data memory cell array 102 outputs, as internal output data DOUT, the data selected by the signal AIN to the output buffer 26 and to the output data error check and correct circuit 28. The redundant data memory cell array 104 outputs, as redundant data POUT, the data selected by the signal AIN to the output data error check and correct circuit 28.

The output data error check and correct circuit 28 uses the internal output data DOUT and the redundant data POUT to perform error correction for the internal output data DOUT and outputs the obtained corrected data DCRT to the selector 22. If any error has been detected in the internal output data DOUT, the output data error check and correct circuit 28 sets the error detection signal ERR to the "H" level and outputs the error detection signal ERR to the control signal input circuit 112 and the selectors 22 and 116.

The selector 22 selects external input data D or the corrected data DCRT according to the error detection signal ERR and the internal write control signal IWE and outputs the selected data to the data memory cell array 102 and the coding circuit 24 as internal input data DIN. When the internal write control signal IWE is activated (i.e., at the "H" level), the selector 22 selects the corrected data DCRT.

The coding circuit 24 generates redundant data PIN for error correction from the internal input data DIN and outputs the generated data to the redundant data memory cell array 104. For example, the coding circuit 24 generates a 6-bit Hamming code as the redundant data PIN from 32-bit internal input data DIN.

The output buffer 26 receives the internal output data DOUT and outputs this data as external output data Q in accordance with the error correction enable signal ECCE. More specifically, when the error correction enable signal ECCE is at the "H" level, the output buffer 26 latches the internal output data DOUT and outputs the latched internal output data DOUT, and when the error correction enable signal ECCE is at the "L" level, the output buffer 26 outputs the internal output data DOUT as it is.

Figure 2:
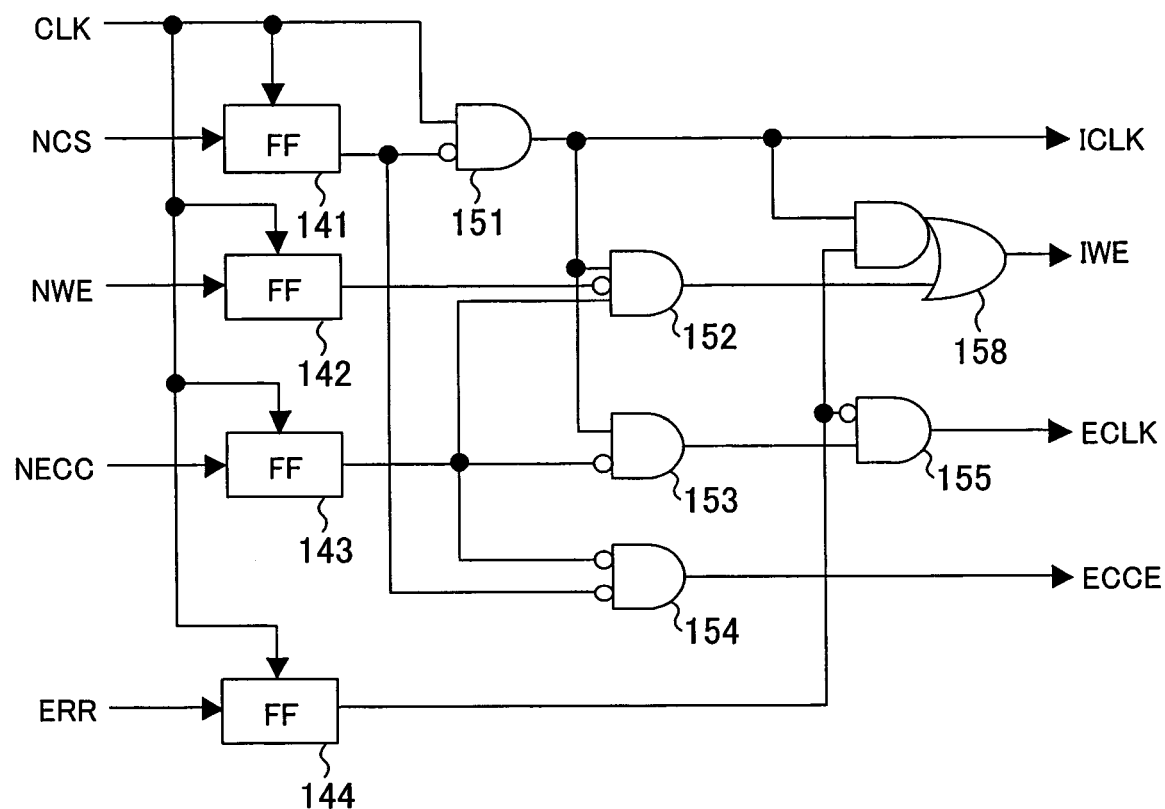
FIG. 2 is a circuit diagram showing the structure of a control signal input circuit shown FIG. 1.

FIG. 2 is a circuit diagram showing the structure of the control signal input circuit 112 of FIG. 1. The control signal input circuit 112 includes flip flops 141, 142, 143 and 144 and logic gates 151, 152, 153, 154, 155, and 158.

The flip flops 141 to 144 receive the memory selection signal NCS, the read/write control signal NWE, the error correction control signal NECC, and the error detection signal ERR, respectively, and each of them outputs the input signal in synchronization with the clock signal CLK.

When the memory selection signal NCS is at the "L" level, the logic gate 151 outputs the clock signal CLK as the internal clock signal ICLK. When the read/write control signal NWE is at the "L" level and the error correction control signal NECC is at the "H" level, the logic gate 158 activates the internal write control signal IWE. In addition, when the error detection signal ERR is at the "H" level, the logic gate 158 outputs the internal clock signal ICLK as the internal write control signal IWE.

When the error correction control signal NECC and the error detection signal ERR are at the "L" level, the logic gate 155 outputs the address counter clock signal ECLK. When the error detection signal ERR becomes at the "H" level, the address counter clock signal ECLK is stopped. When the memory selection signal NCS and the error correction control signal NECC are at the "L" level, the logic gate 154 activates the error correction enable signal ECCE, that is, sets the error correction enable signal ECCE at the "H" level.

Figure 3:
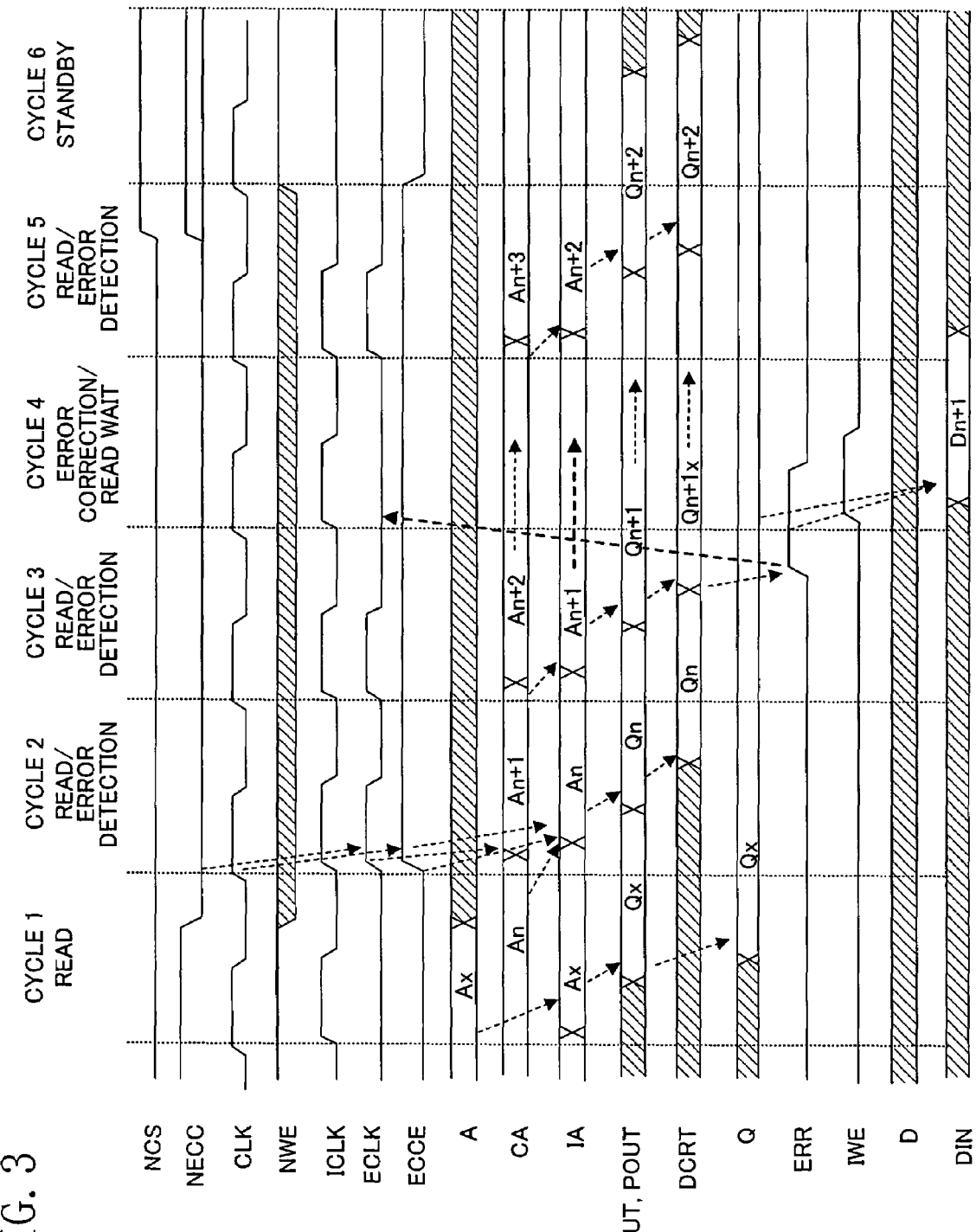
FIG. 3 is a timing chart showing an example of the operation of the memory circuit of FIG. 1.
Figure 4:
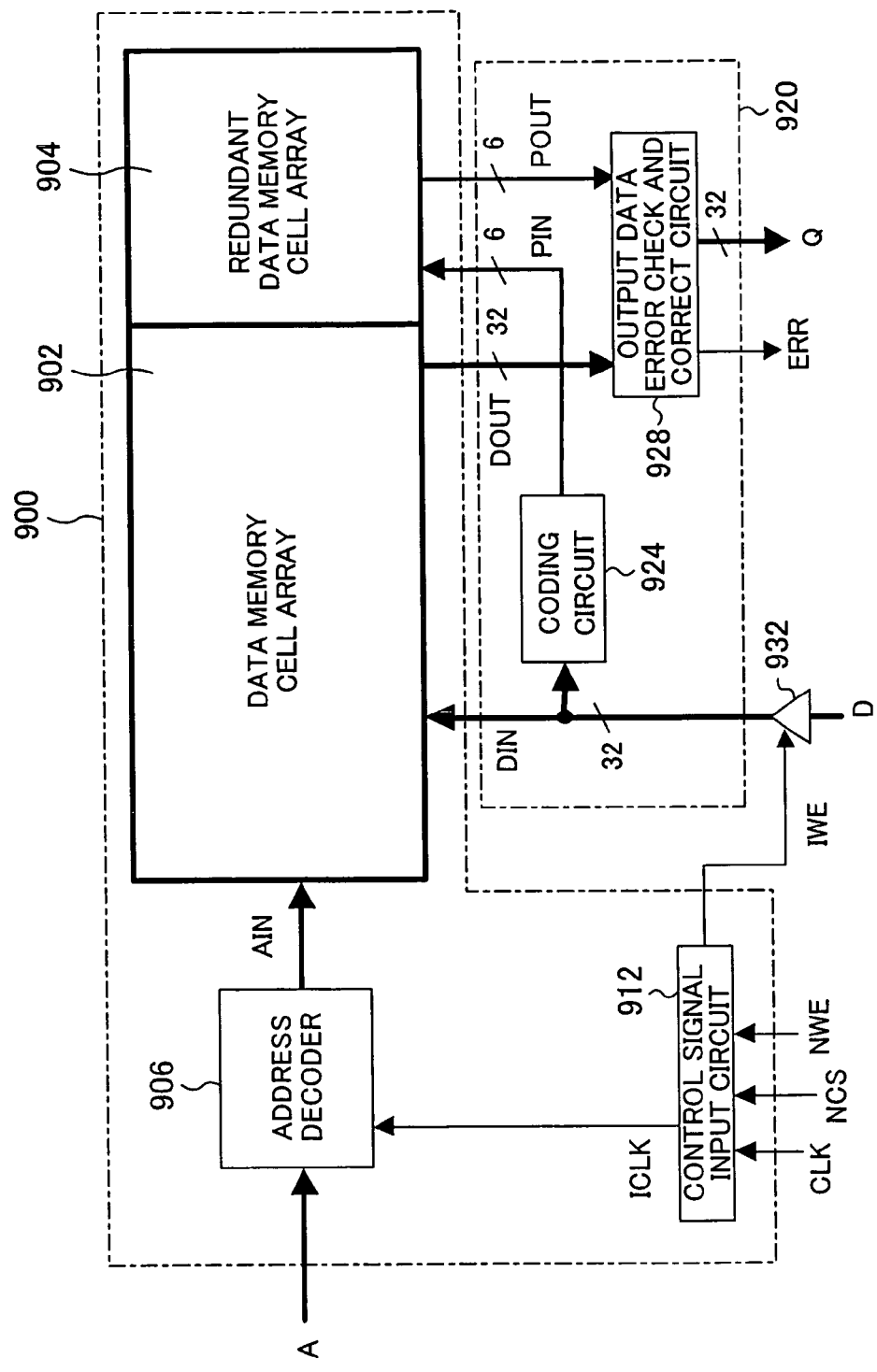
FIG. 4 is a block diagram showing an example of the structure of a conventional memory circuit.
Figure 5:
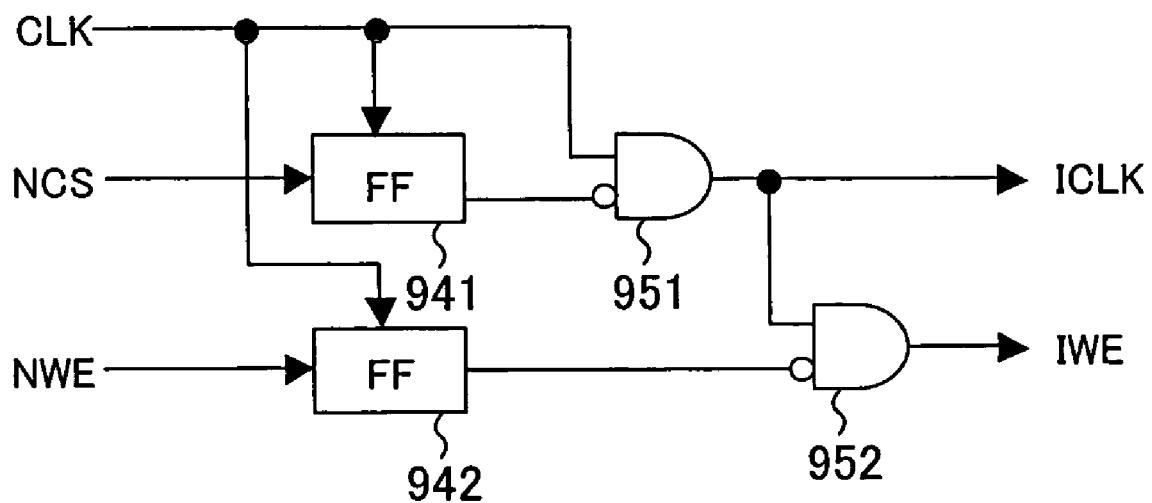
FIG. 5 is a circuit diagram showing the structure of a control signal input circuit shown in FIG. 4.
Figure 6:
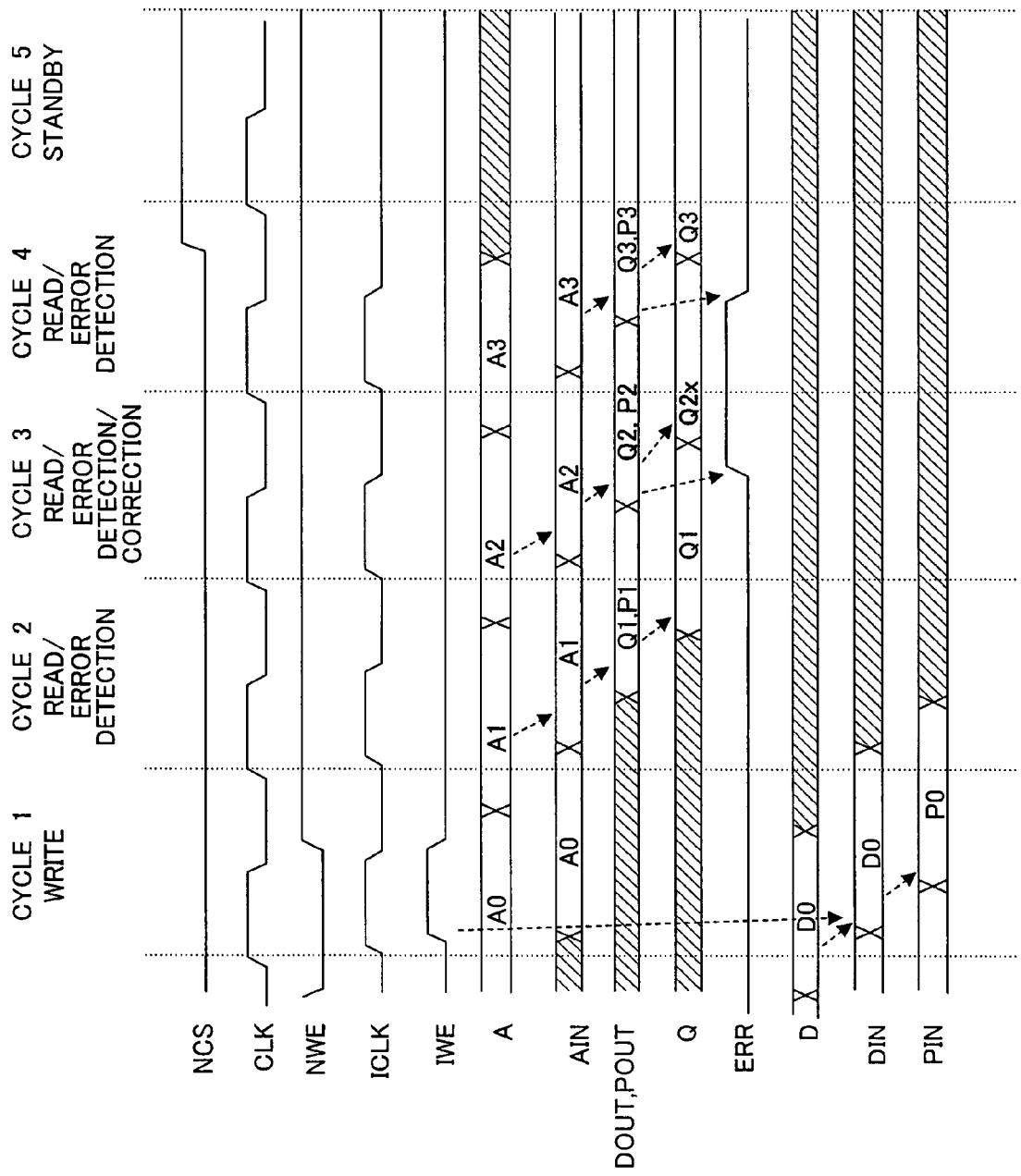
FIG. 6 is a timing chart showing an example of the operation of the memory circuit of FIG. 4.

FIG. 3 is a timing chart showing an example of the operation of the memory circuit of FIG. 1. With reference to FIG. 3, the operation of the memory circuit of FIG. 1 will be discussed. Data input/output into/from the data storage section 100 is performed in synchronization with a rising edge of the clock signal CLK.

In FIG. 3, the cycle 1 is a normal read cycle and the memory circuit is accessed from outside so as to output data stored therein. In this cycle, since the error correction control signal NECC input from outside is at the "H" level, the error correction enable signal ECCE is at the "L" level. Therefore, the selector 116 selects the external address signal A, and the output buffer 26 outputs, as the external output data Q, the internal output data DOUT as it is. The data output at this time does not pass through the output data error check and correct circuit 28 and is thus not subjected to error detection process and error correction process, such that the output access time is not increased.

In the cycles 2 through 5, the memory selection signal NCS is activated to be at the "L" level. In the cycles 2 through 5, the memory circuit is not accessed from outside for data input/output, and readout is performed for detection or correction of any errors in the stored data except at the time of error correction. Therefore, in the cycles 2 through 5, the error correction control signal NECC is activated to be at the "L" level.

The cycle 2 is a read cycle. In the cycle 2, the error correction enable signal ECCE is activated to be at the "H" level at the rising edge of the clock signal CLK, and the address counter clock signal ECLK, which is substantially the same as the internal clock signal ICLK, is output.

When the error correction enable signal ECCE is activated, the selector 116 prohibits the input of the external address signal A and selects and outputs the error correction internal address signal CA output from the address counter 114. The output buffer 26 latches the output data Q ($Q_x$ of FIG. 3) of the previous cycle. Furthermore, the output data error check and correct circuit 28 is activated so as to output the corrected data DCRT.

The address counter 114 increments the error correction internal address signal CA at the rising edge of the address counter clock signal ECLK. The address counter 114 cyclically generates all addresses for designating the data in the data memory cell array 102 and in the redundant data memory cell array 104. For example, where 0 to M have been assigned as the addresses in the data memory cell array 102 and in the redundant data memory cell array 104, the address counter 114 repeatedly counts up from 0 to M.

The cycle 3 is a read cycle. In the cycle 3, if an error has been detected in internal output data $Q_{n+1}$ specified by an internal address $A_{n+1}$ and output from the data memory cell array 102, the output data error check and correct circuit 28 sets the error detection signal ERR at the "H" level.

In the cycle 4, error correction is performed. In the cycle 4, since the error detection signal ERR is at the "H" level, the control signal input circuit 112 stops the address counter clock signal ECLK, the address counter 114 does not increment the error correction internal address signal CA, and the selector 116 retains the same address $A_{n+1}$ as that of the previous cycle and outputs the retaining address.

The control signal input circuit 112 activates the internal write control signal IWE in accordance with the error detection signal ERR, so that the selector 22 selects and outputs the corrected data DCRT as the internal input data DIN. That is, corrected data $Q_{n+1x}$ is supplied as internal input data $D_{n+1}$ to the data memory cell array 102 and the coding circuit 24.

Since the internal address $A_{n+1}$ has been supplied to the data memory cell array 102 and the redundant data memory cell array 104, the internal input data $D_{n+1}$ and redundant data generated based on the internal input data $D_{n+1}$ are written into the data memory cell array 102 and the redundant data memory cell array 104, respectively, at the address $A_{n+1}$.

Specifically, the error-corrected data and the redundant data corresponding to that data are rewritten into the data memory cell array 102 and the redundant data memory cell array 104, respectively, at the address from which the data readout has been performed in the cycle 3.

As described above, in the memory circuit of FIG. 1, the output data error check and correct circuit 28 is provided in parallel with the path for directly outputting read data outside the memory circuit (i.e., the path passing through the output buffer 26 shown in FIG. 1). Therefore, the read data is externally output without being subjected to an error detection or error correction process. This prevents increase in access time caused by the error correction process or the like, thereby allowing high-speed access.

Also, the address counter 114 generates the error correction internal address signal CA in accordance with the error correction control signal NECC in cycles different from the cycles in which access is made from outside the memory to request data input/output, such that error detection and error correction are performed periodically for the data stored in the data memory cell array 102 and the redundant data memory cell array 104. Consequently, in the memory circuit, the rate of occurrence of errors in read data caused by soft errors can be reduced sufficiently for practical use.

For example, assume a case in which a semiconductor SRAM (Static Random-Access Memory) fabricated using 130-nm process technology is used as the memory circuit. In this case, the rate of occurrence of soft errors (soft error rate) per megabit caused by cosmic rays is about $2.1 \times 10^{-5}$ error/hour/Mbit, which indicates that an error occurs once in about five years.

Now, suppose that the SRAM has a capacity of 32K words and an operating frequency of 27 MHz and that error checking is performed, in a cycle that is different from normal access cycles, once in every 10,000 cycles in which the SRAM operates. In this case, all of the bits can be checked $1.4 \times 10^7$ times during the period of time in which a single soft error occurs. And the rate of occurrence of soft errors can be decreased by a factor of $3.6 \times 10^8$ as compared with a case in which the error check and correct circuit is not used. This error rate is completely negligible in practical use.

In the above-described embodiment, the output data error check and correct circuit 28 performs error correction. However, the output data error check and correct circuit may be designed so that is does not perform error correction and outputs results of error detection to the outside of the memory circuit. In that case, error correction is performed outside the memory circuit in accordance with the error detection results and the corrected data is rewritten into the memory circuit.

Moreover, although in the foregoing description the internal output data DOUT is 32 bits and the redundant data POUT is 6 bits in length, each data may have a different number of bits.

Furthermore, although in the foregoing embodiment a clock synchronous memory circuit has been described, a clock asynchronous memory circuit may also be used. The memory circuit may be a semiconductor memory or any other type of memory, so long as it is a memory in which corrupted data can be recovered by a rewrite of data.

As described above, the present invention reduces access time for data output and is thus effectively applicable to a memory circuit or the like that is required to operate at high speed.

What is claimed is:

1. A memory circuit comprising:
a data storage section for storing a plurality of data sets and a plurality of redundant data sets, which are used for error correction for the data sets; and
an error correction section for performing at least error detection for the data sets in the data storage section by using the redundant data sets, when the memory circuit is not accessed from outside for data input or output, and outputting at least result of the error detection as an error detection signal,
wherein when the memory circuit is accessed so as to output a designated one of the stored data sets, the designated data set is outputted without being subjected to the error detection by the error correction section,
wherein the error correction section includes:
an output data error check and correct circuit for performing error correction for the data set read from the data storage section by using a corresponding one of the redundant data sets and outputting the obtained error-corrected data and the error detection signal;
a data selection circuit for selecting the error-corrected data when the error detection signal indicates detection of an error, and, in other situations, selecting data input from outside, and outputting the selected data to the data storage section; and
a coding circuit for generating, based on the data output from the data selection circuit, a redundant data set to be used for error correction for that data and outputting the generated redundant data set to the data storage section,
wherein the data storage section includes:
a data memory cell array for storing the data sets;
a redundant data memory cell array for storing the redundant data sets;
a control circuit for outputting an internal address signal, which is used to access the data memory cell array and the redundant data memory cell array; and
an address decoder for decoding the internal address signal and supplying the decoded signal to the data memory cell array and the redundant data memory cell array,
wherein the control circuit includes an address selector for selecting an error correction internal address signal, generated cyclically for access to the data memory cell array and the redundant data memory cell array, or an external address signal input from outside, latching and then outputting the selected signal as the internal address signal.

2. The memory circuit of claim 1, wherein
the control circuit further includes a control signal input circuit for activating an internal write control signal and outputting the activated signal to the data selection circuit, when the error detection signal indicates detection of an error; and
the data selection circuit outputs the selected data, when the internal write control signal is activated.

3. The memory circuit of claim 1, wherein
an error correction function is executed when an error correction control signal fed into the control circuit is activated.

4. The memory circuit of claim 1, wherein
the error correction section performs error correction for the data set read from the data storage section by using a corresponding one of the redundant data sets and generates a redundant data set to be used for error correction for the obtained error-corrected data set; and
the data storage section rewrites the error-corrected data set and the generated corresponding redundant data set at the same address as that of the data set read from the data storage section.

5. A memory circuit comprising:
a data storage section for storing a plurality of data sets and a plurality of redundant data sets, which are used for error correction for the data sets; and
an error correction section for performing at least error detection for the data sets in the data storage section by using the redundant data sets, when the memory circuit is not accessed from outside for data input or output, and outputting at least result of the error detection as an error detection signal, wherein when the memory circuit is accessed so as to output a designated one of the stored data sets, the designated data set is outputted without being subjected to the error detection by the error correction section, wherein the error correction section includes:

an output data error check and correct circuit for performing error correction for the data set read from the data storage section by using a corresponding one of the redundant data sets and outputting the obtained error-corrected data and the error detection signal;

a data selection circuit for selecting the error-corrected data when the error detection signal indicates detection of an error, and, in other situations, selecting data input from outside, and outputting the selected data to the data storage section; and a coding circuit for generating, based on the data output from the data selection circuit, a redundant data set to be used for error correction for that data and outputting the generated redundant data set to the data storage section, wherein the data storage section includes:

a data memory cell array for storing the data sets;

a redundant data memory cell array for storing the redundant data sets;

a control circuit for outputting an internal address signal, which is used to access the data memory cell array and the redundant data memory cell array; and an address decoder for decoding the internal address signal and supplying the decoded signal to the data memory cell array and the redundant data memory cell array;

wherein the control circuit includes an address selector for selecting an error correction internal address signal, generated cyclically for access to the data memory cell array and the redundant data memory cell array, or an external address signal input from outside, latching and then outputting the selected signal as the internal address signal; and wherein the address selector retains the internal address signal without updating the internal address signal, when the error detection signal indicates detection of an error.

6. The memory circuit of claim 5, wherein the control circuit further includes a control signal input circuit for activating an internal write control signal and outputting the activated signal to the data selection circuit, when the error detection signal indicates detection of an error; and the data selection circuit outputs the selected data, when the internal write control signal is activated.

7. The memory circuit of claim 6, wherein the control signal input circuit activates an error correction enable signal and generates and outputs an address counter clock signal, when an input error correction control signal is activated;

the control circuit includes an address counter for counting the address counter clock signal and outputting the count value as the error correction internal address signal; and the address selector selects the error correction internal address signal when the error correction enable signal is activated, and, in other situations, selects the external address signal.

8. The memory circuit of claim 5, wherein an error correction function is executed when an error correction control signal fed into the control circuit is activated.

9. The memory circuit of claim 5, wherein the error correction section performs error correction for the data set read from the data storage section by using a corresponding one of the redundant data sets and generates a redundant data set to be used for error correction for the obtained error-corrected data set; and the data storage section rewrites the error-corrected data set and the generated corresponding redundant data set at the same address as that of the data set read from the data storage section.

* * * * *